US008928105B2

(12) United States Patent
Ziltener et al.

(10) Patent No.: US 8,928,105 B2
(45) Date of Patent: Jan. 6, 2015

(54) METHOD AND APPARATUS FOR THIN FILM MODULE WITH DOTTED INTERCONNECTS AND VIAS

(75) Inventors: Roger Ziltener, Sursee (CH); Roland Kern, Bülach (CH); David Bremaud, Zürich (CH); Björn Keller, Frauenfeld (CH)

(73) Assignee: Flisom AG, Duebendorf (CH)

( * ) Notice: Subject to any disclaimer, the term of this patent is extended or adjusted under 35 U.S.C. 154(b) by 0 days.

(21) Appl. No.: 13/638,010

(22) PCT Filed: May 27, 2011

(86) PCT No.: PCT/IB2011/052321
§ 371 (c)(1),
(2), (4) Date: Sep. 28, 2012

(87) PCT Pub. No.: WO2011/148346
PCT Pub. Date: Dec. 1, 2011

(65) Prior Publication Data
US 2013/0056758 A1 Mar. 7, 2013

(30) Foreign Application Priority Data
May 28, 2010 (WO) .................. PCT/IB2010/052393

(51) Int. Cl.
*H01L 31/0224* (2006.01)
*H01L 31/0264* (2006.01)
(Continued)

(52) U.S. Cl.
CPC ........ *H01L 31/0392* (2013.01); *H01L 31/0296* (2013.01); *Y02E 10/541* (2013.01); *H01L 31/0322* (2013.01); *H01L 31/0749* (2013.01)
USPC ................. 257/448; 438/28; 438/66; 438/98; 438/662; 438/667; 438/687; 438/767; 257/91; 257/99; 257/184; 257/691; 257/774

(58) Field of Classification Search
CPC ...................... H01L 31/02008; H01L 31/0201; H01L 31/022433; H01L 31/022441; H01L 31/02245; H01L 31/022458; H01L 31/0296; H01L 31/0322; H01L 31/0392; H01L 31/03923; H01L 31/03925; H01L 31/05; H01L 31/0504; H01L 31/0508; H01L 31/0516; H01L 31/0749; H01L 31/022425; H01L 31/188; H01L 27/1423; Y02E 10/541
USPC ........ 136/243–265; 257/88, 91, 99, 184, 448, 257/691, 692, 774, 776, E31.113, E31.124, 257/E33.056; 438/28, 57–98, 662, 667, 438/687, 768
See application file for complete search history.

(56) References Cited

U.S. PATENT DOCUMENTS
4,697,041 A * 9/1987 Okaniwa et al. .............. 136/244
(Continued)

FOREIGN PATENT DOCUMENTS
EP 0 422 511 A2 4/1991
(Continued)

OTHER PUBLICATIONS
P.-O. Westin, U. Zimmermann, M. Edoff, Laser patterning of P2 interconnect via in thin-film CIGS PV modules, Solar Energy Materials and Solar Cells, vol. 92, Issue 10, Oct. 2008, pp. 1230-1235, ISSN 0927-0248, http://dx.doi.org/10.1016/j.solmat.2008.04.015.*
(Continued)

*Primary Examiner* — Fernando L Toledo
*Assistant Examiner* — Christine C Lau
(74) *Attorney, Agent, or Firm* — Patterson & Sheridan LLP

(57) ABSTRACT
A method to fabricate monolithically-integrated optoelectronic module apparatuses (100) comprising at least two series-interconnected optoelectronic components (104, 106, 108). The method includes deposition and scribing on an insulating substrate or superstate (110) of a 3-layer stack in order (a, b, c) or (c, b, a) comprising: (a) back-contact electrodes (122, 124, 126, 128), (b) semiconductive layer (130), and (c) front-contact components (152, 154, 156, 158). Via holes (153, 155, 157) are drilled so that heat of the drilling process causes a metallization at the surface of said via holes that renders conductive the semi-conductive layer's surface (132, 134, 136, 138) of said via holes, thereby establishing series-interconnecting electrical paths between optoelectronic components (104, 106, 108) by connecting first front-contact components (154, 156) to second back-contact electrodes (124, 126).

24 Claims, 5 Drawing Sheets

(51) Int. Cl.
*H01L 31/05* (2014.01)
*H01L 31/0296* (2006.01)
*H01L 31/032* (2006.01)
*H01L 31/0392* (2006.01)
*H01L 31/0749* (2012.01)

(56) References Cited

U.S. PATENT DOCUMENTS

| | | | |
|---|---|---|---|
| 4,965,655 A * | 10/1990 | Grimmer et al. | 257/56 |
| 6,011,215 A * | 1/2000 | Glatfelter et al. | 136/249 |
| 6,300,593 B1 | 10/2001 | Powell | |
| 6,372,538 B1 | 4/2002 | Wendt et al. | |
| 6,919,530 B2 | 7/2005 | Borgeson et al. | |
| 7,276,724 B2 | 10/2007 | Sheats et al. | |
| 7,512,297 B2 * | 3/2009 | Farah | 385/14 |
| 7,635,810 B2 * | 12/2009 | Luch | 136/256 |
| 7,649,141 B2 | 1/2010 | Schmit et al. | |
| 7,732,243 B2 * | 6/2010 | Luch | 438/57 |
| 7,838,868 B2 * | 11/2010 | Sheats et al. | 257/21 |
| 7,998,838 B2 * | 8/2011 | Rekow et al. | 438/460 |
| 8,048,706 B1 | 11/2011 | Ghandour et al. | |
| 8,153,889 B2 * | 4/2012 | Basol | 136/256 |
| 8,158,514 B2 * | 4/2012 | Kruger et al. | 438/667 |
| 8,263,494 B2 | 9/2012 | Patterson | |
| 8,329,496 B2 | 12/2012 | Ghandour | |
| 8,569,094 B2 | 10/2013 | Stolt et al. | |
| 8,716,591 B2 | 5/2014 | Misra et al. | |
| 2004/0261839 A1 | 12/2004 | Gee et al. | |
| 2008/0023065 A1 * | 1/2008 | Borden et al. | 136/256 |
| 2008/0314439 A1 | 12/2008 | Misra | |
| 2009/0065060 A1 | 3/2009 | Yonezawa et al. | |
| 2009/0145472 A1 * | 6/2009 | Li | 136/244 |
| 2009/0229666 A1 * | 9/2009 | Corneille et al. | 136/262 |
| 2009/0301543 A1 * | 12/2009 | Reddy et al. | 136/244 |
| 2010/0147356 A1 * | 6/2010 | Britt | 136/244 |
| 2011/0041890 A1 * | 2/2011 | Sheats | 136/244 |
| 2011/0048506 A1 * | 3/2011 | Pichler | 136/251 |
| 2012/0000502 A1 * | 1/2012 | Wiedeman et al. | 136/244 |
| 2012/0094425 A1 | 4/2012 | Ghandour et al. | |
| 2012/0240995 A1 * | 9/2012 | Coakley | 136/256 |
| 2013/0000715 A1 * | 1/2013 | Moslehi et al. | 136/256 |

FOREIGN PATENT DOCUMENTS

| | | |
|---|---|---|
| EP | 0 478 839 A1 | 4/1992 |
| EP | 2 437 317 A2 | 4/2012 |
| JP | 02043776 | 2/1990 |
| JP | 2009529805 A | 8/2009 |
| WO | 2006126590 A1 | 11/2006 |
| WO | 2007106756 | 9/2007 |
| WO | WO-2007/106756 A2 | 9/2007 |
| WO | WO 2007106756 A2 * | 9/2007 |
| WO | WO-2009/084888 A2 | 7/2009 |
| WO | WO 2009084888 A2 * | 7/2009 |
| WO | WO-2010/032465 A1 | 3/2010 |
| WO | 2012/048872 A1 | 4/2012 |

OTHER PUBLICATIONS

International Search Report for PCT/IB2011/052321, mailed Oct. 14, 2011; ISA/EP.

Wennerberg et al. "Cu (In, Ga) Se2-Based Thin-Film Photovoltaic Modules Optimized for Long-Term Performance", Solar Energy Materials & Solar Cells 75 (2003) 47-55.

Westin, et al. "Laser Patterning of P2 Interconnect via in Thin-Film CIGS PV Modules", Solar Energy Materials & Solar Cells 92, (2008) 1230-1235.

JP Office Action dated Sep. 17, 2014 for Application No. 2013-511781.

English Translation of JP Office Action dated Sep. 17, 2014 for Application No. 2013-511781.

* cited by examiner

METHOD AND APPARATUS FOR THIN FILM MODULE WITH DOTTED INTERCONNECTS AND VIAS

CROSS-REFERENCE TO RELATED APPLICATIONS

This application is a 371 U.S. National Stage of International Application No. PCT/IB2011/052321, filed on May 27, 2011, which claims priority to International Application No. PCT/IB2010/052393, filed on May 28, 2010. The contents of the above applications are incorporated herein by reference in their entirety

FIELD OF THE INVENTION

The present invention relates to monolithic optoelectronic devices such as photovoltaic modules and more particularly to electrical interconnections between photovoltaic module optoelectronic components and their connection to busbars.

BACKGROUND OF THE INVENTION

Thin-film photovoltaic modules, a variety of which is also known as thin-film solar modules, are generally composed of a number of electrically interconnected optoelectronic components. Such components may be optoelectronic devices such as photovoltaic cells and additional optional components such as diodes and other electronic devices. Photovoltaic modules usually also include electrically interconnecting components such as cell-to-cell connectors and busbars.

Multilayer thin-film technologies enable the monolithic integration and interconnection of several optoelectronic components and associated components on a same substrate. This integration is produced in situ using a sequence of layer deposition and scribing techniques. Thin-film optoelectronic or photovoltaic components or devices are essentially composed of a stack of three material layers: a conducting back-contact electrode layer, a semiconductive photovoltaic material layer, also known as the absorber, and another conducting front-contact electrode layer, said front-contact layer usually being transparent. Photovoltaic cells based on semiconductive material such as $Cu(In,Ga)Se_2$ (CIGS) or CdTe show a high potential for less expensive solar electricity, lower energy payback time, and improved life-cycle impact as compared to traditional wafer-based silicon photovoltaic devices or solar cells.

Compared to wafer-based photovoltaic devices, monolithic photovoltaic modules may have lower costs thanks to reduced material quantities used by thin films, reduced labor costs of monolithic integration, and ease of automatic production of large quantities of photovoltaic modules, for example using roll-to-roll manufacturing techniques. Further savings can be obtained by increasing the relative area of photovoltaic components exposed to light, for example by reducing the area occupied by: front-contact grids that collect current over the photovoltaic cell's front-contact electrode, electrical interconnects between optoelectronic components, and busbars. Photovoltaic module production yields may also be increased thanks to a reduction in the number of production steps, for example by reducing the number of scribing operations needed to delineate and structure the interconnects of optoelectronic components in thin-film monolithic photovoltaic modules.

Photovoltaic modules have been developed that attempt to reduce losses induced by electrical component shadowing over photovoltaic components or areal occupancy over the light exposed side. For example U.S. Pat. No. 7,649,141 describes a thin silicon wafer with laser-drilled wrap-through conducting holes, also known as vias, that connect the front-contact components to back-contact components, thereby avoiding shadowing by grid components laid on the front-contact surface, with the benefit of high current collection efficiency. U.S. Pat. No. 7,276,724 describes series-interconnected optoelectronic device modules thanks to the forming of vias, for example using laser ablation, and the addition of conductive material to drive current between front and back-side top electrodes as well as to a second adjacent module. U.S. Pat. No. 7,276,724 uses laser drilling to create circular isolation trenches and notices that this may cause short circuits between front- and back-contacts that are undesirable on the outer circumference of the trench but desirable on the inner circumference. U.S. Pat. No. 7,276,724 describes designs for the series interconnection of optoelectronic device modules, each including a device layer on a 100 microns-thick back-contact electrode, itself separated by an insulating layer from a backside top electrode, said optoelectronic device modules being attached to an insulating carrier substrate.

Although wrap-through vias are highly advantageous to reduce shading and increase relative exposed surface, a problem with their manufacture is that they usually require drilling and subsequent metallizing. This requires additional production steps which may add costs and decrease yield. Some of these steps can be avoided with the monolithic optoelectronic module production method described in the present invention.

SUMMARY OF THE INVENTION

A problem in the field of monolithic photovoltaic module production relates to the interconnection of photovoltaic components at the minimum expense of light-exposed area while providing the greatest possible current throughput and highest production yield. The design of interconnected photovoltaic components typically requires ablative and contacting processing steps that may decrease production yield as a function of the number of components. It is therefore an object of the current invention to provide a method to produce interconnected thin-film monolithic photovoltaic module apparatuses of decreased cost and higher production yield.

It is a further object of the current invention to provide a method of making interconnects between optoelectronic components of monolithic photovoltaic modules that may comprise photovoltaic cells, diodes, grids, and busbars. It is also a further object of the current invention to provide monolithic photovoltaic module apparatuses that can be fabricated using roll-to-roll production methods. It is yet a further object of the current invention to provide apparatuses resulting from the method, in the form of monolithic photovoltaic module embodiments, that exploit the method to augment the light to electricity conversion of said photovoltaic modules.

One embodiment of the present invention is created by providing a monolithic photovoltaic module. This module may comprise a substrate or a superstrate upon which a succession of layers are deposited and ablative traces are scribed, possibly followed by the placement of a conductive front-contact grid, followed by the placement of electrical busbars, followed by encapsulating the module inside at least two layers of protective material. Someone with ordinary skill in the art will infer that the order of the front-contact grid placement and busbar placement can be modified.

The invention takes advantage of a scribing method, preferably using a laser, where heat associated to the scribing process causes a permanent metallization of the inner surface of the semiconductive material layers' scribed cavities, thereby enabling the design and production of cost-efficient series-interconnected optoelectronic components and subsequent monolithic optoelectronic module apparatuses. The method thereby provides a range of monolithic optoelectronic module apparatuses comprising interconnected components such as photovoltaic components, diodes, optional front-contact grids, and busbars.

In greater detail, a main aspect of the invention provides a method of fabricating monolithically-integrated optoelectronic modules comprising at least two series-interconnected optoelectronic components, such as photovoltaic, diode, or light-emitting diode components, starting from an initial electrically insulating layer positioned either as a substrate under, or as a superstrate on top of, a stack of layers produced by the following steps conducted in the order (a), (b), (c) if said initial insulating layer is positioned for a substrate configuration, or in the order (c), (b), (a) if said initial insulating layer is positioned for a superstrate configuration.

The method according to the invention comprises the steps of:

(a) depositing an electrically conductive layer, called the back-contact layer, onto said initial insulating layer or onto the semiconductive layer from step (b); cutting at least one groove, herein called back-contact groove, into the back-contact layer so as to expose at least one continuous line of said insulating layer or of said semiconductive layer, thereby providing at least one first and at least one second back-contact components that are electrically disconnected;

(b) depositing at least one semiconductive layer including at least one semiconductive optoelectronically active layer, onto the layer deposited in the previous step (a) or (c), thereby filling said grooves, and wherein said semiconductive optoelectronically active layer is made for example of CdTe or of an $ABC_2$ material, wherein A represents elements in group 11 of the periodic table of chemical elements as defined by the International Union of Pure and Applied Chemistry including Cu and Ag, B represents elements in group 13 of the periodic table including In, Ga and Al, and C represents elements in group 16 of the periodic table including S, Se and Te; and (c) depositing at least one conductive front-contact layer onto the layer deposited in the previous step (b) or onto said insulating layer; cutting at least one groove therein, called front-contact groove, into said front-contact layers, such as to expose at least one continuous line of said layer deposited in the previous step or said insulating layer, thereby providing at least one first and at least one second front-contact components that are electrically disconnected, said first and second front-contact components comprising parts that overlie corresponding first and second back contact components.

The method according to the invention further comprises the step, for at least one of said second back-contact components, of drilling at least one cell-to-cell via hole through layers deposited at steps (b) and (c) such that said cell-to-cell via hole exposes part of said back contact layer and/or insulating layer, using a drilling process that generates heat such that heat of said drilling process causes a permanent change in the chemical composition of the surface of said cell-to-cell via hole within said semiconductive layers by causing a surface metallization so that the surface of said cell-to-cell via hole becomes electrically conductive, to establish an electrical path between at least one of said first front-contact components and at least one corresponding second back-contact component, thereby realizing at least two series-interconnected optoelectronic components.

Preferably the cell-to-cell via holes are drilled to extend through said back-contact components.

The method also preferably further includes the step of placing at least one electrical conductor that forms a busbar using at least one conductive adhesive component so that an electrical path is established between said busbar and at least one back-contact component, said surface metallization, and/or front-contact component.

The inventive method also preferably includes the steps of:
drilling at least one first via hole, herein called busbar-to-back-contact via hole, so as to expose part of at least one of said back-contact components;
placing at least one first electrical conductor forming a first busbar using at least one conductive adhesive component so that an electrical path is established between said first busbar and said back-contact component;
drilling at least one second via hole, herein called busbar-to-front-contact via hole, passing through at least one of said front-contact components and such that none of said busbar-to-front-contact via holes passes through back-contact components exposed by said busbar-to-back-contact via holes; and
placing at least one second electrical conductor forming a second busbar using at least one conductive adhesive component so that an electrical path is established between said second busbar and said front-contact component.

The method can also further include the step of depositing at least one metalized grid component made of at least one metalized trace onto said front-contact components of said substrate configuration, wherein said metalized grid component extends from at least one said via hole filling at least one of said via holes with metalized material.

According to another main aspect, the invention provides a monolithically-integrated optoelectronic module apparatus comprising at least two series-interconnected optoelectronic components, such as photovoltaic, diode, or light-emitting diode components, said optoelectronic module comprising an electrically insulating layer positioned either as a substrate under, or as a superstrate on top of, the following stack of layers (a), (b), (c):

(a) a layer comprising at least one first and at least one second electrically conductive front-contact components, said first and second front-contact components being separated by a groove making said first and second front-contact components electrically separate;

(b) a layer comprising at least one semiconductive optoelectronically active layer wherein at least one of said semiconductive layers is for example made of CdTe or of an $ABC_2$ material, wherein A represents elements in group 11 of the periodic table of chemical elements as defined by the International Union of Pure and Applied Chemistry including Cu and Ag, B represents elements in group 13 of the periodic table including In, Ga, and Al, and C represents elements in group 16 of the periodic table including S, Se and Te;

(c) a layer comprising at least one first and at least one second electrically conductive back-contact components deposited onto said electrically insulating layer wherein said first and second back-contact components are separated by a back-contact groove making said back-contact components electrically separate, thereby realizing first and second separate optoelectronic components each comprising a stack of said front-contact components, at least one said semiconductive layer, and said back-contact component;

said optoelectronic module further comprising at least one via hole passing through at least one of said first front-contact components and said semiconductive layers, thereby exposing part of at least one said second back-contact components, and wherein the surface of said via hole at the level of said semiconductive optoelectronically active layers has a compositional change through permanent metallization of metal elements contained for example in CdTe or in said $ABC_2$ material of the semiconductive optoelectronically active layers, such permanent metallization being obtainable by local heating produced by drilling of said via hole, said permanent metallization establishing an electrical path between said first front-contact component and said second back-contact component and realizing a series-interconnection between a first optoelectronic component and a second optoelectronic component.

Preferably the via holes extend through said back-contact components.

The aforementioned via holes can be positioned in at least one row parallel to said back-contact groove such that the closest row is at a distance of at least 5 micrometers, more preferably 50 micrometers from said back-contact groove.

Also, the via holes can be shaped as a line segment located at a distance of at least 50 micrometers from said front-contact groove, and such that at least one second back-contact component comprises a finger-shaped extension passing under said first front-contact component and reaching said via hole so that at least one deported series-interconnection is realized.

The apparatus can further comprise at least one metalized grid component made of at least one metalized trace deposited onto at least one said front contact component, said metalized trace extending from at least one via hole.

Preferably, at least one of the metalized grid components presents a pattern wherein one of said via holes is located centrally within said pattern. Also, at least one of the via holes can be filled with conductive material contributing to the electrical contact between at least one of said front-contact components and back-contact components.

The apparatus can further comprise: at least one first electrical conductor forming a first busbar connected by at least one conductive adhesive component so that an electrical path is established between said first busbar and said back-contact component; at least one busbar-to-front-contact via hole passing through at least one of said front-contact components such that none of said busbar-to-front-contact via holes passes through back-contact components exposed by said busbar-to-back-contact via holes; and at least one second electrical conductor forming a second busbar connected by at least one conductive adhesive component so that an electrical path is established between said second busbar and said front-contact component.

Embodiments disclose variations with substrate or superstrate, non-shadowing busbars, size and number of current-collecting grids, encapsulating material, depth and/or shape and/or location and/or number of vias.

The apparatus is advantageously encapsulated within at least one front sheet and at least one back sheet, said front sheet being preferably of glass or, more preferably, of thermoplastic polymer material.

BRIEF DESCRIPTION OF FIGURES

FIG. 1H also shows the resulting module's encapsulation.

DETAILED DESCRIPTION OF SPECIFIC EMBODIMENTS

FIGS. 1A to 5B depict four exemplary embodiments of the invention, each embodiment being representative of a technical variation of how the method is used. Someone skilled in the art will appreciate that the scales of the various components represented in the figures have been changed to improve clarity. Furthermore, the number and areas of components in the figures are highly variable and would be scaled up in the framework of an industrial production.

Figure 1A:
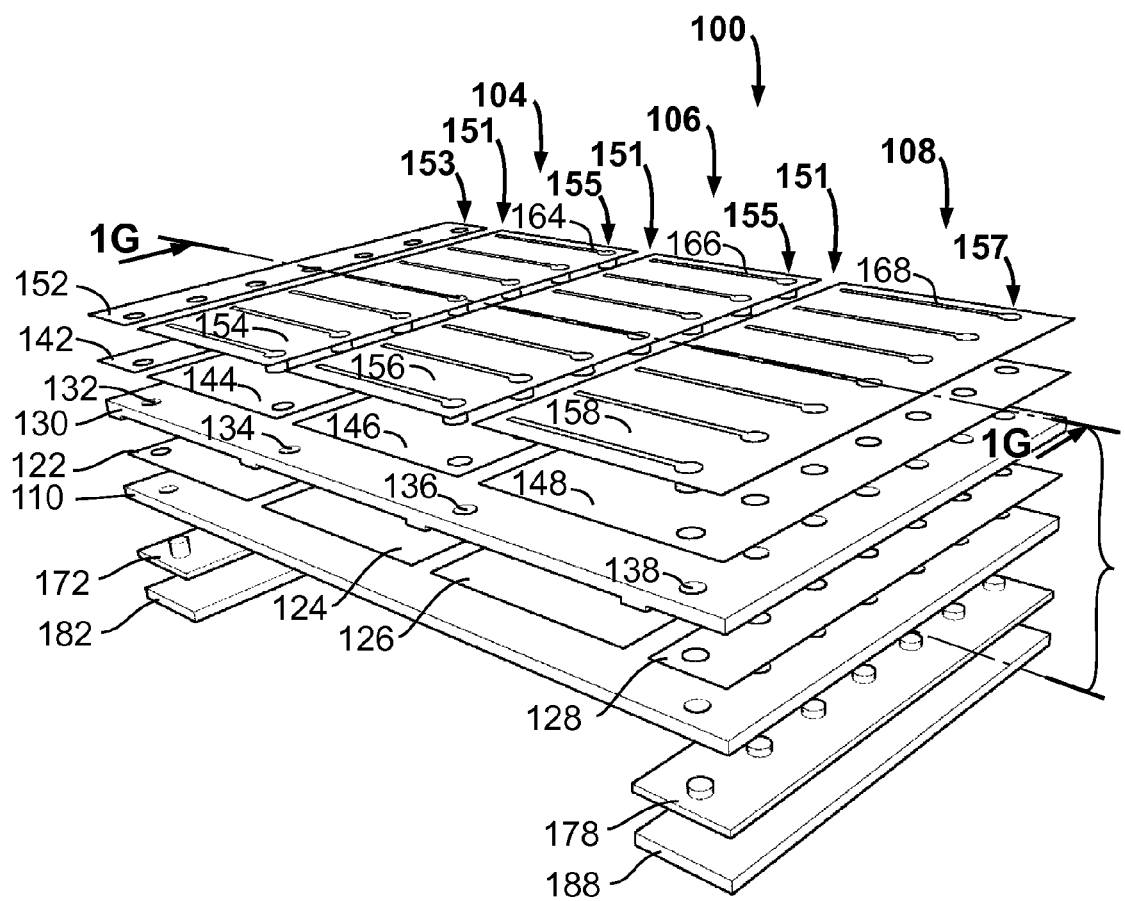
FIG. 1A shows an exploded view from above of an embodiment of the present invention showing a monolithic photovoltaic module comprising: 3 photovoltaic cells that are series-interconnected by metalized dotted via holes, busbars connected via metalized busbar vias, and metalized front-contact grid traces.

FIG. 1A shows an exploded view of an embodiment of a monolithic photovoltaic module 100 that comprises three series-interconnected optoelectronic devices 104, 106, 108. Said optoelectronic devices 104, 106, 108 may be photovoltaic devices, diodes, or light-emitting diodes. An embodiment of said photovoltaic module 100 would contain at least one of said optoelectronic devices, preferably several of said optoelectronic devices. In a preferred embodiment said optoelectronic devices are photovoltaic devices, also known as solar cells. Said photovoltaic module of optoelectronic devices is manufactured monolithically on an electrically insulating substrate 110. Said substrate is coated with several material layers, by a method which is subsequently detailed in FIGS. 1A-1H. Photovoltaic module 100 therefore comprises a back-contact layer of separate electrically conductive electrodes 122, 124, 126, 128. Said back-contact layer is overlaid by a semiconductive photovoltaic material layer 130, itself overlaid by two layers divided into components: a buffer layer represented by components 142, 144, 146, 148, and a front-contact layer represented by components 152, 154, 156, 158. Said buffer layer components and said front-contact layer components are separated by grooves 151 through said buffer layer and said front-contact layer so as to design a pattern of adjacent and electrically separated components, thereby providing optoelectronic devices 104, 106, 108. Electrically interconnecting via holes 155 pass through said front-contact and said buffer, and continue deeper as conductive metalized via holes 138 through the entire thickness of semiconductive photovoltaic layer 130 so that an electrically conductive path is established between the said front-contact layer of a first said optoelectronic device and the said back-contact layer of a second said optoelectronic device. The series interconnection of optoelectronic components is completed at each electrical extremity of the series-interconnected path of module 100 by extended via holes 153, 157 drilled across the entire thickness of said photovoltaic module, thereby piercing back-contact components 122, 128 and continuing through substrate 110. Multiple metalized front-contact grid components 164, 166, 168 may be added to advantageously augment front-contact conductivity. Electrical busbars 182, 188 are then electrically connected via respective conductive attachments 172, 178, for example using conductive paste, to respective back-contact components 122, 128.

FIGS. 1B to 1H are cross-sectional figures that depict the method or process to fabricate the monolithic photovoltaic module 100 depicted in FIG. 1A. The process comprises a sequence of material layer deposition, scribing, front-contact grid deposition, attachment of busbars, and encapsulation. The overall thickness of thin-film material deposited onto the module's substrate is typically about 3 to 5 micrometers.

Figure 1B:
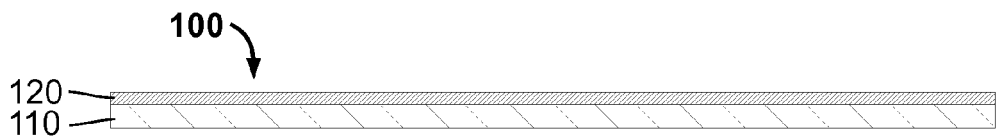
FIGS. 1B-1H show cross-sectional schematic diagrams illustrating the deposition and scribing sequence on a substrate to form the embodiment presented in FIG. 1A.

FIG. 1B shows an electrically insulating substrate 110 onto which successive material layers are to be deposited. Said electrically insulating substrate may be of a variety of electrically insulating materials, preferably a thin and flexible material so as to permit roll-to-roll production, most preferably a thermally-stable material, such as polyimide, that can sustain temperatures of about 400-600° C. Said electrically insulating substrate is initially coated with an electrically conductive layer 120. Said electrically conductive layer, also known as the back-contact, may be of a variety of electrically conductive materials, preferably having a coefficient of thermal expansion (CTE) that is close both to that of the said substrate 110 onto which it is laid and to that of other materials that are to be subsequently laid upon it. More preferably said conductive layer has a high optical reflectance. Most preferably said conductive layer does not react in a chemically destructive manner with other materials that are to be subsequently laid upon it. In ordinary practice, layer 120 is deposited in a process called sputtering, and is commonly made of Mo although several other materials such as tin-doped indium oxide (ITO), ZrN, TiN, Ti, W, Ta, and Nb may also be used advantageously.

Figure 1C:
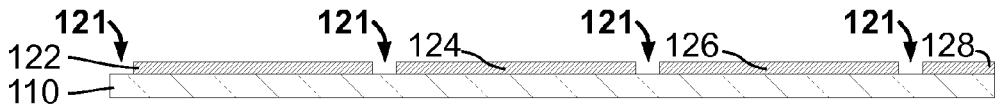

FIG. 1C shows the process step where grooves 121 are cut into back-contact layer 120 so as to expose at least one continuous line of the substrate, thereby providing a set of first back-contact components 122, 124, 126 and a respective corresponding set of second back-contact components 124, 126, 128 that are electrically disconnected. Said process step is referred to as scribing or patterning step P1. Patterning step P1 may be done using a mechanical scribing blade, preferably using a laser, such as a nanometer or picometer laser, more preferably using a pulsed laser. Except for back-contact components 122, 128 situated at module extremities, other back-contact components 124, 126 are preferably of equal area and shape.

Figure 1D:
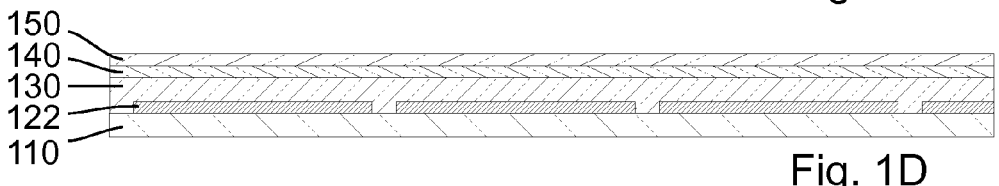

FIG. 1D represents the next process step where at least one said semiconductive photovoltaic layer 130, also known as the absorber layer, is deposited onto said back-contact components, thereby also filling grooves 121 of FIG. 1C. Layer 130 is preferably made of CdTe or of an $ABC_2$ material, wherein A represents elements in group 11 of the periodic table of chemical elements as defined by the International Union of Pure and Applied Chemistry including Cu or Ag, B represents elements in group 13 of the periodic table including In, Ga, and/or Al, and C represents elements in group 16 of the periodic table including S, Se, or Te. A preferred semiconductive photovoltaic layer is for example of the so-called CIGS type, thereby containing Cu, In, Ga, and $Se_2$. Layer 130 may be deposited using a variety of techniques such as electrodeposition, printing, or vapor deposition. Subsequent substantially transparent layers include a so-called semiconductive buffer layer 140, for example made of CdS or ZnS material, and a front-contact conductive oxide (TCO) layer 150, for example made of ZnO:Al material or of tin-doped indium oxide (ITO) material.

Figure 1E:
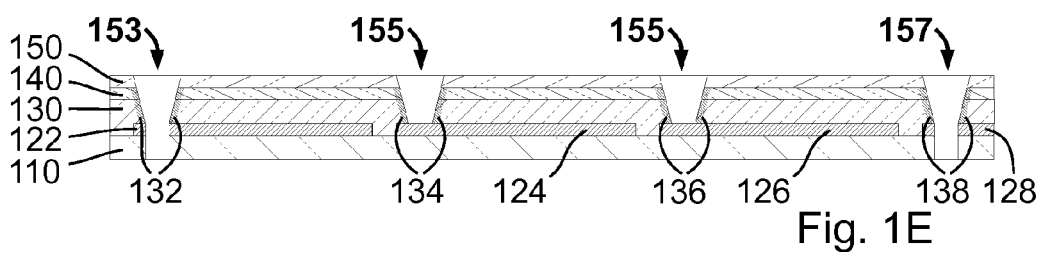

FIG. 1E represents the process step where two types of via hole rows are scribed: cell-to-cell vias 155 and busbar vias 153, 157. Said process step where via hole rows 155, 153, 157 are drilled or scribed, preferably with a laser, such as a nanometer or picometer laser, more preferably a pulsed laser, is referred to as scribing or patterning step P2. Cell-to-cell vias 155 are drilled with the objective of establishing a serial interconnection between what will, at the end of the manufacturing process, be a first cell, for example cell 104, and a second cell, for example cell 106. For each of said second back-contact components 124, 126, at least one cell-to-cell via hole 155 is drilled through said conductive front-contact layer 150 and through said semiconductive active layers 130 such that said cell-to-cell via hole 155 is deep enough to expose part of at least one of said second back-contact components 124, 126, and such that heat produced along the surface of said cell-to-cell via hole 155 when being drilled causes a permanent change in the chemical composition of said surface within said semiconductive layers 130, 140, therein causing a surface metallization 134, 136. The surface of said cell-to-cell via hole 155 therefore becomes electrically conductive, thereby establishing an electrical path between said conductive front-contact layers 150 and said second back-contact components 124, 126. For example, in the case of a CIGS-type semiconductive photovoltaic layer, the conductive surface of said cell-to-cell via holes is copper-rich, and in the case of a CdTe-type semiconductive photovoltaic layer, the conductive surface of said cell-to-cell via holes is cadmium-rich. In FIG. 1E said back-contact components 124, 126 are exposed by the drilling but not necessarily ablated by the drilling process, however. FIG. 1E shows vias with a symmetrical conical cross-section shape but someone skilled in the art will readily infer that a large variety of via shapes is possible. A variation of the via shape is presented in FIGS. 5A and 5B. Furthermore, the method to form said busbar vias 153, 157 is a variation in the method used to form said cell-to-cell vias 155 in that the vias extend further through back-contact components 122, 128 as well as through said substrate 110. Since said busbar vias 153, 157 are drilled using a method similar to that of said cell-to-cell vias 155, such as laser scribing, metalized via hole surfaces 132, 138 are formed and therefore provide an electrically conductive path between said front-contact layer 150 and said back-contact components 122, 128, respectively. To be effective, at least one of said vias must be formed per each back-contact component 122, 124, 126, 128. In practice, however, for example to enable increased current throughput, several of each vias per said back-contact component may be formed so as to advantageously carry more electrical current.

Figure 1F:
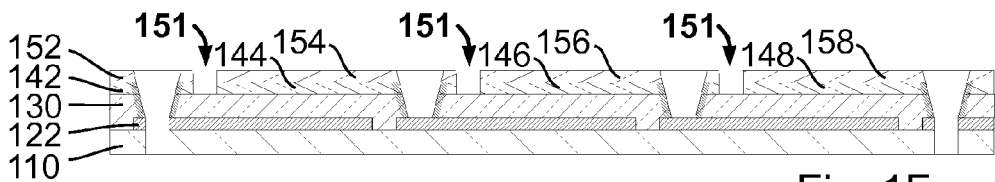

FIG. 1F represents the process step where grooves, also called front-contact grooves 151, are cut through said front-contact layer 150 and extend deep enough to expose continuous lines of at least one of said semiconductive layers 130, 140, thereby separating said front-contact layers into a first busbar front-contact component 152, first front-contact components 154, 156, and second front-contact components 156, 158 that are electrically disconnected, and such that at least one said cell-to-cell via hole 155 per each first front-contact component 154, 156 establishes a series-interconnected electrical path from said first front-contact components 154, 156 mostly overlying said first back-contact components 122, 124 to said second back-contact components 124, 126, thereby realizing three series-interconnected optoelectronic components 104, 106, 108. Said process step is referred to as scribing or patterning step P3. Patterning step P3 may be done using a mechanical scribing blade, preferably using a laser, such as a nanometer or picometer laser, more preferably a pulsed laser.

From FIGS. 1E and 1F, someone ordinarily skilled in the art can infer that said scribing steps P2 (for vias) and P3 (for grooves) can advantageously be combined into a single scribing step P(vias+grooves) where said cell-to-cell vias 155, said busbar vias 153, 157, and said grooves 151 are scribed using, for example, at least one laser scribing tool. To manufacture cell-to-cell contacts, conventional methods for monolithic photovoltaic module production using vacuum deposition consist in depositing said buffer layer 140, scribing step P2 down to said back-contact layer, depositing said front-contact layer 150, and then executing high-precision scribing step P3 to separate said front contact components. The step-by-step sequence may include breaking vacuum one or more times. The present invention therefore provides an advantageous method where vacuum does not need to be broken between the deposition of said buffer layer 140 and said front-contact layer 150, thereby saving time, energy, and reducing costs. A further advantage is that the present invention provides a larger scribing process window that does not require as much precision as conventional methods, thereby allowing the use of less precise and less expensive laser scribing tools, allowing faster scribing steps, and providing higher yields thanks to a lower error rate. Yet more advantages of the present invention are that said busbar vias 153, 157 enable the placement of busbars behind the semiconductive photovoltaic layer without inducing shadowing losses (FIG. 1H), and also that the location of said busbar vias can be decided after depositing all layers, thereby offering greater busbar networking options.

Figure 1G:
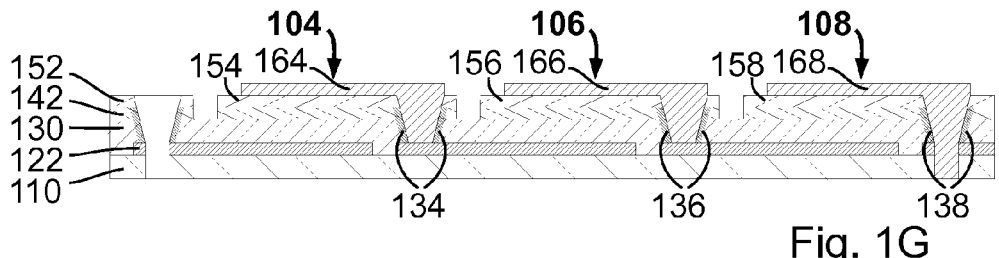

FIG. 1G shows a cross-section where a grid of metalized front-contact traces 164, 166, 168 are added to augment the conductivity of respective said front-contact components 154, 156, 158. Said front-contact traces may be made of silver or other compound that may be screen-printed, electroplated, dispensed, ink-jet printed, or subject to physical vapor deposition (PVD), possibly in multiple steps in combination with metal plating or other treatments. Said front-contact traces may extend into via holes so as to further increase conductivity between said front-contact components 154, 156, 158, and respective metalized via hole surfaces 134, 136, 138. The optoelectronic module consequently comprises three optoelectronic cells 104, 106, 108.

Figure 1H:
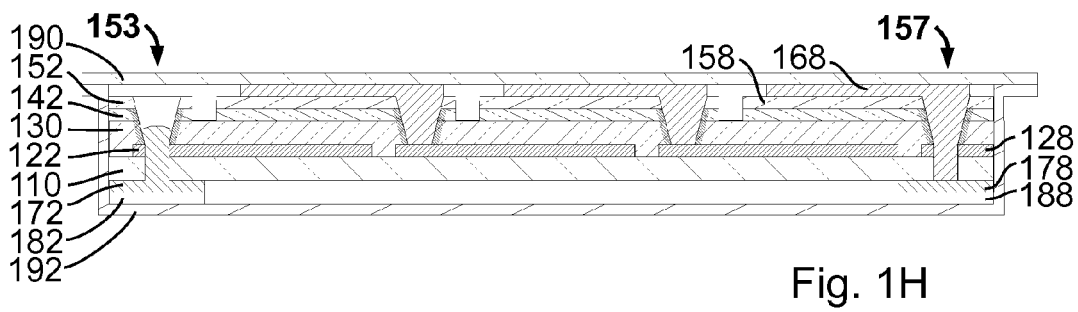

FIG. 1H shows the addition of busbars 182, 188 using respective conducting adhesive components 172, 178. In ordinary practice, said conducting adhesive components are segments of conductive paste that may penetrate busbar via holes 153, 157, so as to ensure that an electrical path is established between busbar 182 and back-contact component 122, and also so that the electrical conductivity is increased between busbar 188 and front-contact 158. In FIG. 1H this electrical path is also ensured by said grid trace 168 and said metalized via hole surface 138 of said semiconductive substrate 130 at the level of back-contact 128. Finally, said optoelectronic module 100 is encapsulated within at least one front (190) and at least one bottom (192) sheet, front sheet 190 being preferably of glass or, more preferably, of transparent or translucent thermoplastic polymer material.

FIGS. 2A to 2D are cross-sectional views that depict the method to fabricate a monolithic optoelectronic module 100 that is similar to the previous module 100 except that a transparent superstrate is used. In other words, module 100 is now designed so that light that reaches its photovoltaic components first passes through the transparent superstrate prior to electrical conversion by absorber 130.

Figure 2A:
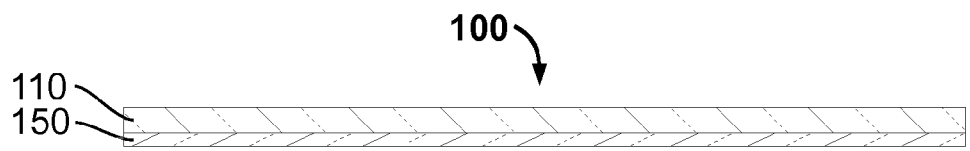
FIGS. 2A-2D show cross-sectional views of a variation of the embodiment depicted in FIGS. 1A-1H but where a superstrate is used instead of a substrate.

FIG. 2A shows a transparent and electrically insulating superstrate 110, for example made of polyimide, onto which at least one front-contact layer 150 of conductive material is deposited.

Figure 2B:
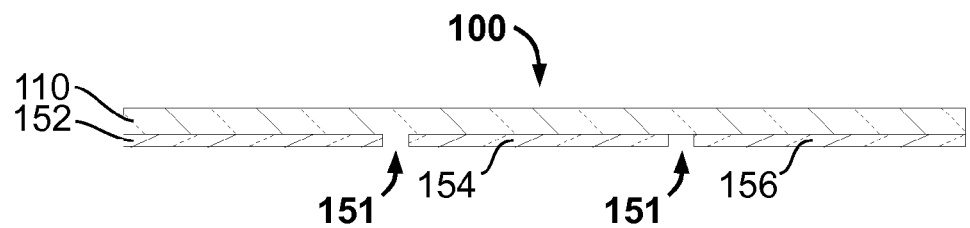

FIG. 2B shows the step where front-contact grooves 151 are scribed to separate said front-contact layer 150 into front-contact components 152, 154, 156. Said front-contact grooves 151 continuously expose superstrate 110, thereby ensuring there is no electrically conducting path between front-contact components 152, 154, 156.

Figure 2C:
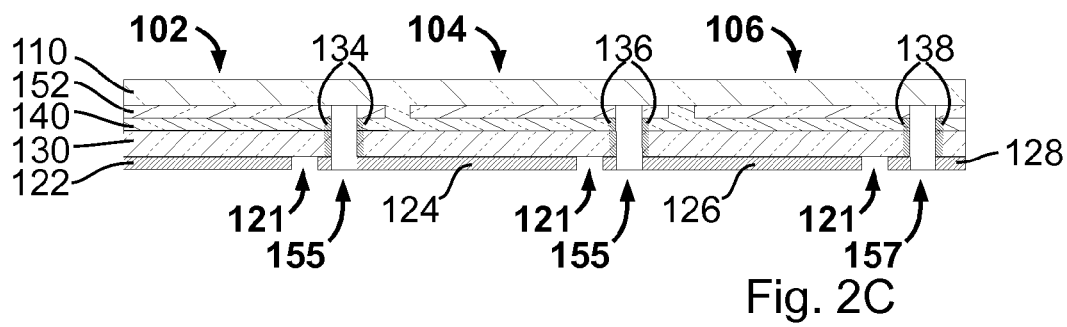

FIG. 2C shows the deposition of at least one semiconductive buffer layer 140 followed by the deposition of at least one photovoltaic semiconductive layer 130. Said photovoltaic semiconductive layer 130 is preferably made of CdTe material but other materials such as said $ABC_2$ material are also possible. This is followed by the deposition of an electrically conductive back-contact layer. Back-contact grooves 121 are then scribed to separate said back-contact layer into back-contact components 122, 124, 126, 128. Said back-contact grooves 121 extend at least until the surface of said semiconductive photovoltaic layer 130 so that there is no direct electrically conducting path between said back-contact components 122, 124, 126, 128. Said back-contact grooves 121, however, must not extend so deep as to further section said front-contact components 152, 154, 156. Cell-to-cell vias 155 and busbar vias 153, 157 are also scribed, preferably using a laser scribing process, so that local heat caused by scribing causes the inner-surface 134, 136, 138 of said vias 155, 157, to permanently become electrically conductive, as explained in the description of FIG. 1E. Said cell-to-cell vias 155 and busbar vias 157 are drilled so as to establish a series-interconnection between a first front-contact component 152, 154, 156, mostly overlying a respective first back-contact component 122, 124, 126, and a respective second back-contact component 124, 126, 128. Someone ordinarily skilled in the art will infer that grooves 121 and vias 155, 157 can be scribed in a single scribing step.

Figure 2D:
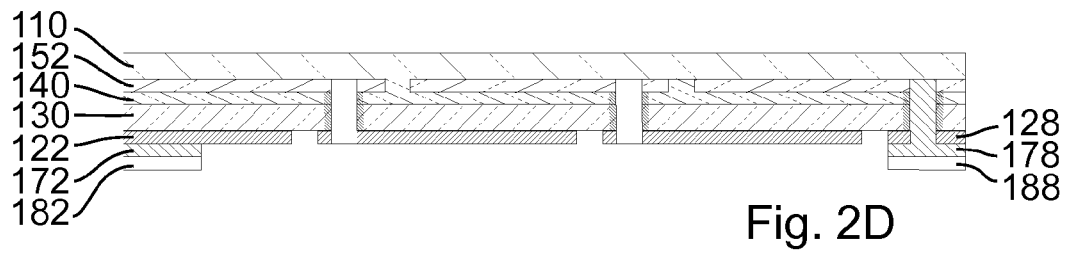

FIG. 2D shows the addition of busbars 182, 188 using respective conducting adhesive components 172, 178. In ordinary practice, said conducting adhesive components are segments of conductive paste that may penetrate busbar via holes 157 so as to increase electrical conductivity between busbar 188 and front-contact 156.

Figure 3A:
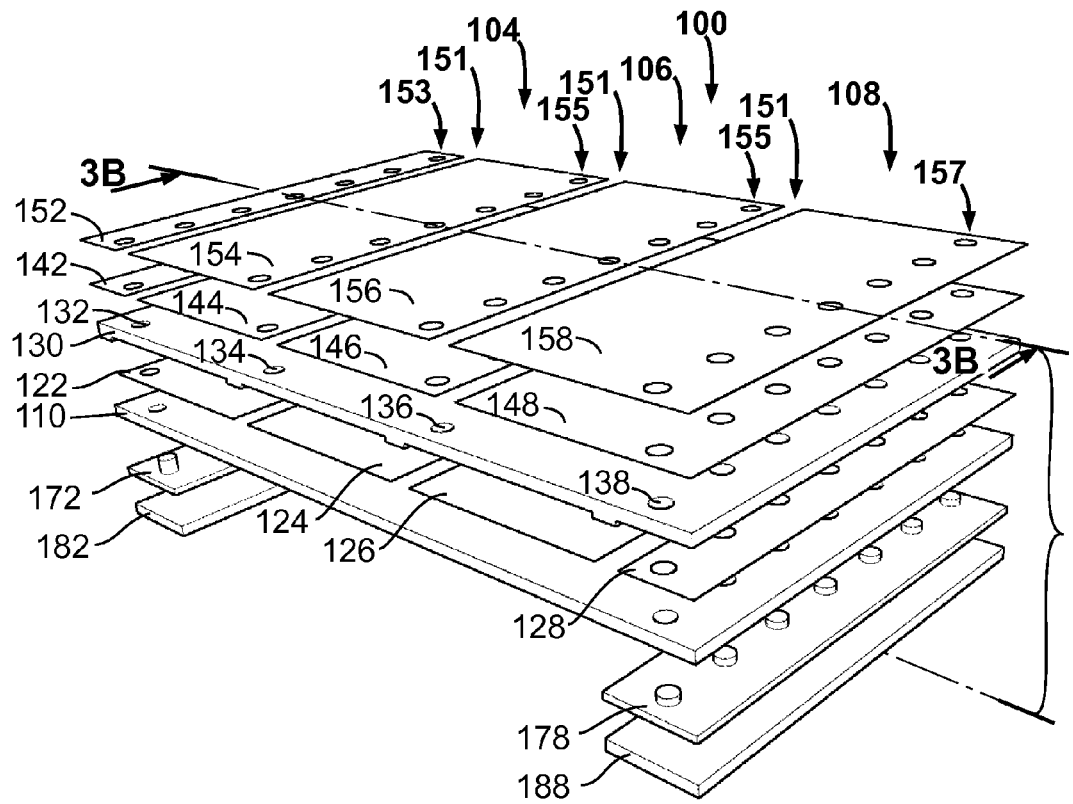
FIG. 3A-3B show exploded and cross-sectional views of a variation of the embodiment depicted in FIGS. 1A-1H with no metalized front-contact grid lines.
Figure 3B:
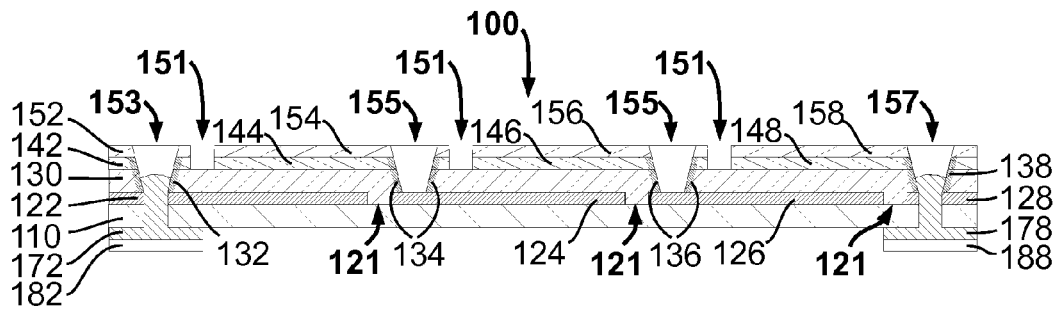

FIGS. 3A and 3B show an exploded view and a cross-section of an embodiment of a monolithic photovoltaic module 100 that represents a variation of embodiment 100 of FIGS. 1A-1H where said front-contact grid traces 164, 166, 168 are not present. This photovoltaic module 100 is therefore very similar to the aforementioned photovoltaic module 100. Said photovoltaic module 100 comprises substrate 110 coated with a conductive back-contact layer that is scribed into separate back-contact components 122, 124, 126, 128. Successive layers comprise a semiconductive photovoltaic layer 130 followed by buffer and front-contact layers that are scribed into respective buffer components 142, 144, 146, 148 and front-contact components 152, 154, 156, 158. Said front-contact and said buffer components are drilled, preferably using a laser, to produce vias 155 through to surface of said back-contact components and said vias 153, 157 all the way through said substrate 110, thereby producing conductive metalized via surfaces 132, 134, 136, 138. Busbars 182, 188 are electrically connected via respective conductive attachments 172, 178 to respective back-contact components 122, 128. Cross-section 3B shows that conductive attachments 172, 178, for example made of conductive paste, must extend at least till back-contacts 122, 128, respectively. Although said vias are represented in FIG. 3A as a single row along grooves 151 or along the axes of busbars 182, 188, someone ordinarily skilled in the art will infer that numerous vias may be drilled at many locations over the surface of module 100. This embodiment 100 may be advantageous in that no front-contact grids are used, thereby removing one manufacturing processing step in comparison to the method used to manufacture the previous embodiment 100. This embodiment 100 may also be advantageous because front-contact grid traces, in the case of a photovoltaic module, introduce a shadowing loss that may reduce photovoltaic electricity production.

Figure 4:
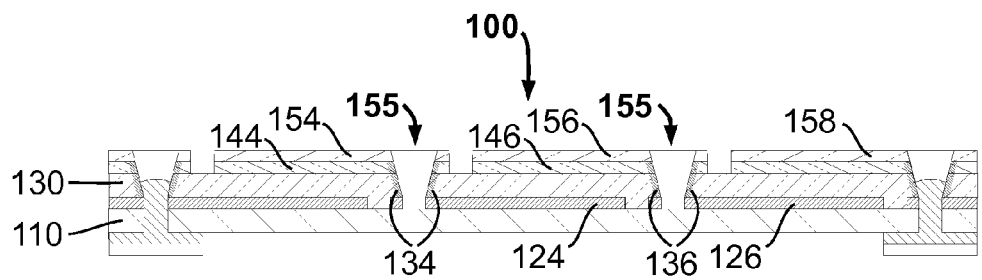
FIG. 4 shows a cross-sectional schematic diagram of a variation of the embodiment depicted in FIGS. 3A-3B but where vias are drilled into the back contact components.

FIG. 4 shows the cross-section of an embodiment of a monolithic photovoltaic module 100 that represents a variation of embodiment 100 of FIGS. 3A and 3B where vias 155 are drilled through said front-contact components 154, 156, respective buffer components 144, 146, said semiconductive photovoltaic layer 130 where respective heat-treated inner via surfaces 134, 136 are also formed, and through respective back-contact components 124, 126 till the surface of substrate 110. The resulting embodiment is advantageous in that less precision is required to manufacture this monolithic optoelectronic module 100 in comparison to the previous modules. Said reduction in precision advantageously allows to use less precise and less expensive scribing tools, reduces manufacturing time, reduces the failure rate of the scribing process and therefore increases production yield.

Figure 5A:
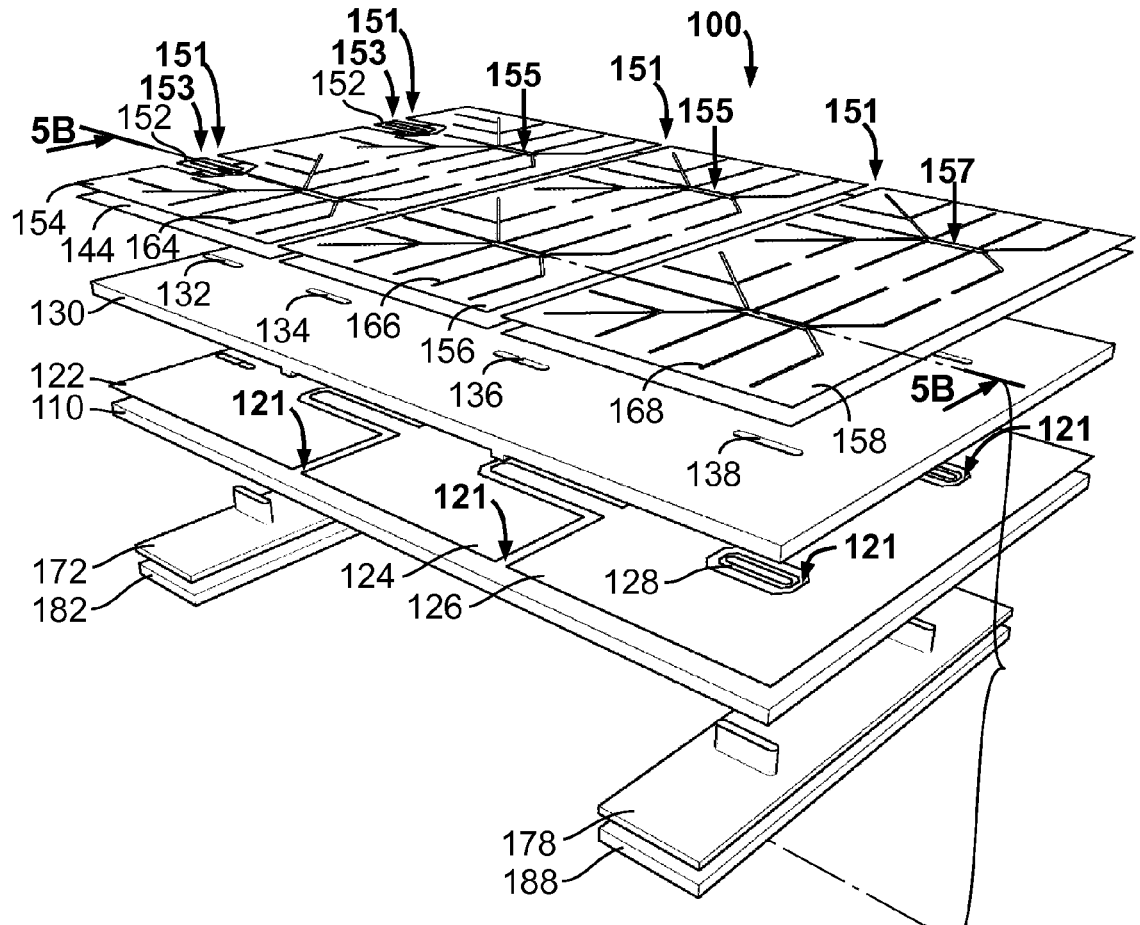
FIGS. 5A-5B show exploded and cross-sectional views of another embodiment of a monolithic photovoltaic module with dotted interconnects where the vias are elongated, more centrally located in their respective solar cells than in FIGS. 1A-1H, and fed by radial metalized front-contact grid lines.
Figure 5B:
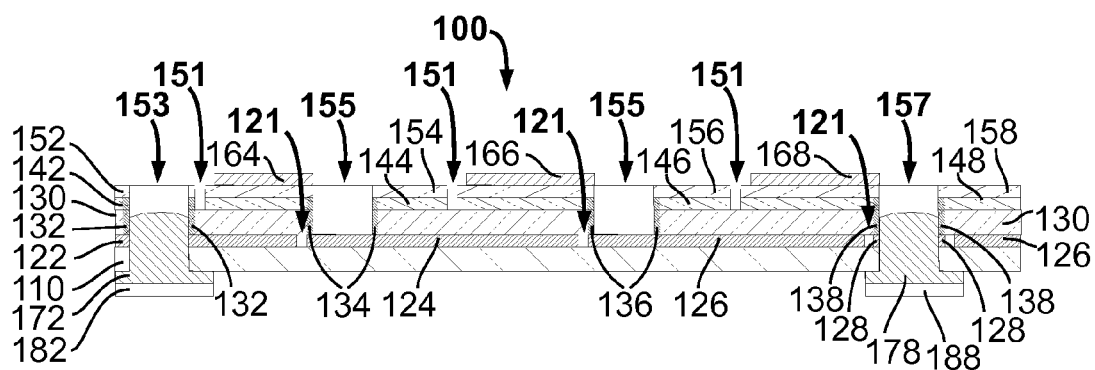

FIGS. 5A and 5B show an exploded view and a cross-section of an embodiment of a monolithic photovoltaic module 100 that presents a variation of embodiment 100 of FIGS. 1A-1H where via holes 153, 155, 157 may be elongated and more centrally located on front-contact components 152, 154, 156, 158. The method to produce this embodiment is very similar to that used to produce the previous embodiments. Substrate 110 is coated with a conductive layer that is subject to scribing paths 121 that produce back-contact components 122, 124, 126, 128. FIG. 5A shows that said scribing paths 121 are not straight lines so as to allow aforementioned positioning variation of subsequently produced vias. Said scribing paths 121 draw second back-contact components with finger-shaped extensions designed to pass under later deposited and scribed first front-contact components. Semiconductive photovoltaic layer 130 is then deposited and followed by the application of buffer and front-contact layers. Via holes 155 are then scribed, preferably using a local heat-producing scribing tool such as a laser, through said front-contact layer, said buffer layer, and said semiconductive photovoltaic layers till the surface of said back-contact components 124, 126. Via holes 153, 157, are also scribed, preferably using a local heat-producing scribing tool such as a laser, through all aforementioned layers and said substrate. As in FIG. 1E, said local heat-producing scribing tool renders conductive the surface of elongated vias 153, 155, 157, at said semiconductive photovoltaic layer 130, thereby producing metalized via hole surfaces 132, 134, 136, 138. Said front-contact and buffer layers are then scribed into electrically separate front-contact components 152, 154, 156, 158, and buffer components 142, 144, 146, 148. Patterned metalized front-contact grid components 164, 166, 168 may then be added to advantageously augment front-contact conductivity. Someone ordinarily skilled in the art will infer that the patterns of said grid components 164, 166, 168 represented in FIGS. 5A and 5B may be designed differently so that the resulting photovoltaic module 100 provides optimal desired performance with respect to power generation and cost. Busbars 182, 188 are connected via respective electrically conductive attachments 172, 178 to respective back-contact components 122, 128. The resulting embodiment is advantageous in that: said vias may be elongated and therefore scribed more efficiently using a scanning device such as a scanning laser, said vias may also be advantageously elongated so as to provide more conductive surface per via hole to drive more electrical current between front- and back-contact, more efficient shadow-minimizing grid components may also be designed thanks to the more central location of said vias on said front-contact components.

The exemplary embodiments and method disclosed by the present invention are especially advantageous for roll-to-roll production of photovoltaic modules of interconnected optoelectronic components. Someone skilled in the art will readily infer how to scale and adapt the illustrated exemplary embodiments for low-cost and large-scale production of monolithic optoelectronic modules. The main benefit of the invention is to provide several advantageous exemplary optoelectronic module embodiments and a corresponding method where, for example in the context of the substrate-based embodiment of FIGS. 1A-1H, metalized cell-to-cell vias 155 that interconnect photovoltaic components, metalized busbar vias 153, 157 that enable connection of non-shadowing busbars to modules, and grooves 151 that separate components can be manufactured at the same production step, thereby advantageously reducing production complexity, time, costs, and number of tools.

The invention claimed is:

1. A method of fabricating monolithically-integrated optoelectronic modules comprising at least two series-interconnected optoelectronic components, comprising the steps of:
   cutting at least one continuous back-contact groove into a back-contact layer, wherein cutting the at least one continuous back-contact groove forms at least one first and at least one second back-contact component that are electrically disconnected from each other;
   cutting at least one continuous front-contact groove into a front-contact layer to form at least one first and at least one second front-contact components that are electrically disconnected from each other, and wherein at least a portion of the at least one first or the at least one second front-contact components overlap with the at least one second or first back contact components, respectively;
   forming at least one semiconductive layer that comprises at least one semiconductive optoelectronically active layer, wherein a portion of the at least one semiconductive layer is disposed between the front-contact layer and the back-contact layer, and the semiconductive optoelectronically active layer comprises a CIGS-type $ABC_2$ material, where A comprises copper, B comprises indium and gallium, and C comprises selenium; and
   drilling at least one cell-to-cell via hole, wherein the drilling the at least one cell-to-cell via hole and the cutting the at least one continuous front-contact groove are performed after the front contact layer, the semiconductive layer and the back contact layer are formed, and wherein heat provided in the drilling process causes:
      a removal of a portion of the front-contact layer and a portion of the at least one semiconductive layer to form the cell-to-cell via hole, wherein a portion of the back contact layer is exposed in the formed cell-to-cell via hole; and
      a permanent change in the chemical composition of the surface of the semiconductive layer(s) in the cell-to-cell via hole, wherein an electrically conductive permanently metalized copper-rich CIGS-type $ABC_2$ material forms on the surface of the cell-to-cell via hole during the removal of the portion of the at least one semiconductive layer, and thereby forming an electrically conductive path on the surface of the via hole, between at least one of the first front-contact components and at least one second back-contact component, thereby forming the at least two series-interconnected optoelectronic components.

2. The method according to claim 1, wherein the at least one cell-to-cell via hole extends through the at least one first back-contact component or the at least one second back-contact component.

3. The method according to claim 1, further comprising a step of placing at least one electrical conductor that forms a busbar using at least one conductive adhesive component so that an electrical path is established between the busbar and at least one of the first or second back-contact components, the electrically conductive permanently metalized copper-rich CIGS-type $ABC_2$ material, and/or the first or second front-contact components.

4. The method according to claim 1, further comprising depositing at least one metalized grid component made of at least one metalized trace onto the first and the second front-contact components, wherein the metalized grid component extends from the at least one cell-to-cell via hole.

5. The method according to claim 1, further comprising filling the at least one cell-to-cell via hole with an electrically conductive material.

6. The method of claim 1, wherein the drilling the at least one cell-to-cell via hole and the cutting the at least one continuous front-contact groove are performed during the same step.

7. The method of claim 6, further comprising sequentially depositing the semiconductive layer and depositing the front-contact layer, without exposing the semiconductive layer to air.

8. A method of fabricating monolithically-integrated optoelectronic modules comprising at least two series-interconnected optoelectronic components, comprising:

cutting at least one continuous back-contact groove into a back-contact layer, wherein cutting the at least one continuous back-contact groove forms at least one first and at least one second back-contact component that are electrically disconnected from each other;

cutting at least one continuous front-contact groove into a front-contact layer to form at least one first and at least one second front-contact components that are electrically disconnected from each other, and wherein at least a portion of the at least one first or the at least one second front-contact components overlap with the at least one second or first back contact components, respectively;

forming at least one semiconductive layer that comprises at least one semiconductive optoelectronically active layer, wherein a portion of the at least one semiconductive layer is disposed between the front-contact layer and the back-contact layer, and the semiconductive optoelectronically active layer comprises a GIGS-type $ABC_2$ material, where A comprises copper, B comprises indium and gallium, and C comprises selenium;

drilling at least one cell-to-cell via hole, wherein heat provided in the drilling process causes a permanent change in the chemical composition of the surface of the semiconductive layer(s) in the cell-to-cell via hole, by causing an electrically conductive permanently metalized copper-rich GIGS-type $ABC_2$ material to form on the surface of the cell-to-cell via hole, and an electrical conductive path to form between at least one of the first front-contact components and at least one second back-contact component, thereby forming the at least two series-interconnected optoelectronic components;

drilling at least one busbar-to-back-contact via hole so as to expose part of a first or a second back-contact component;

forming a first busbar so that an electrical path is established between the first busbar and the exposed part of the first or the second back-contact component;

drilling at least one busbar-to-front-contact via hole that passes through at least one of the first or second front-contact components, wherein the at least one busbar-to-front-contact via hole passes through the first or the second back-contact component exposed by the at least one busbar-to-back-contact via hole; and forming a second busbar using at least one conductive adhesive component so that an electrical path is established between the second busbar and the exposed part of the first or the second front-contact component.

9. A monolithically-integrated optoelectronic module, comprising:

a front contact layer comprising at least one first and at least one second electrically conductive front-contact components, the first and second front-contact components being electrically isolated from each other by a front-contact groove;

a semiconductive layer comprising at least one semiconductive optoelectronically active layer, wherein the at least one semiconductive optoelectronically active layer comprises a CIGS-type $ABC_2$ material, wherein A comprises copper, B comprises indium and gallium, and C comprises selenium;

a back-contact layer comprising at least one first and at least one second electrically conductive back-contact components, wherein the first and the second back-contact components are electrically isolated from each other by a back-contact groove;

at least two series-interconnected optoelectronic components, wherein each of the at least two series-interconnected optoelectronic components comprise a first optoelectronic component and a second optoelectronic component that each comprise at least a portion of the semiconductive layer, at least a portion of the first or the second front-contact component and at least a portion of the first or the second back-contact component, wherein the monolithically-integrated optoelectronic module further comprises at least one via hole passing through at least a portion of a first front-contact component and at least one semiconductive optoelectronically active layer, thereby exposing a portion of at least one second back-contact component, and wherein the surface of the at least one via hole at the level of the at least one semiconductive optoelectronically active layer comprises permanently metalized copper-rich CIGS-type $ABC_2$ material formed when the at least one via hole is formed, and the permanently metalized copper-rich CIGS-type $ABC_2$ material forms an electrically conductive path between the first front-contact component and the at least one second back-contact component, on the surface of the at least one via hole, thereby forming a series-interconnection between a first optoelectronic component and a second optoelectronic component.

10. The apparatus according to claim 9, wherein the at least one via hole extends through the at least one second back-contact component.

11. The apparatus according to claim 9, wherein the at least one via hole comprises a plurality of via holes that are positioned in at least one row parallel to a back-contact groove such that the at least one row is at a distance of at least 5 micrometers from the back-contact groove.

12. The apparatus according to claim 9, wherein the at least one via hole comprises a line segment located at a distance of at least 50 micrometers from a front-contact groove, and such that at least one second back-contact component comprises a finger-shaped extension passing under the first front-contact component and reaching the via hole so that at least one series-interconnection is formed.

13. The apparatus according to claim 9, further comprising at least one metalized grid component made of at least one metalized trace deposited onto at least one of the front contact component, the metalized trace extending from the at least one via hole.

14. The apparatus according to claim 13, wherein at least one of the metalized grid components is formed in a pattern, and wherein one of the via holes is located centrally within the pattern.

15. The apparatus according to claim 9, wherein the at least one via hole is filled with an electrically conductive material.

16. The apparatus according to claim 9, which is encapsulated within at least one front sheet and at least one back sheet, the front sheet comprising glass or a thermoplastic polymer material.

17. The monolithically-integrated optoelectronic module of claim 9, further comprising at least one busbar-to-back-contact via hole that exposes part of at least one of the first or the second back-contact components.

18. A monolithically-integrated optoelectronic module apparatus comprising at least two series-interconnected optoelectronic components, wherein the monolithically-integrated optoelectronic module comprises:
a front contact layer comprising at least one first and at least one second electrically conductive front-contact components, the first and second front-contact components being electrically isolated from each other by a front-contact groove;
a semiconductive layer comprising at least one semiconductive optoelectronically active layer, wherein the at least one semiconductive optoelectronically active layer comprises a CIGS-type $ABC_2$ material, wherein A comprises copper, B comprises indium and gallium, and C comprises selenium;
a back-contact layer comprising at least one first and at least one second electrically conductive back-contact components, wherein the first and the second back-contact components are electrically isolated from each other by a back-contact groove;
wherein each of the at least two series-interconnected optoelectronic components comprise a first optoelectronic component and a second optoelectronic component that each comprise at least a portion of the second layer, at least a portion of the first or the second front-contact component and at least a portion of the first or the second back-contact component, and
wherein the monolithically-integrated optoelectronic module further comprises at least one via hole passing through at least a portion of a first front-contact component and at least one semiconductive optoelectronically active layer, thereby exposing part of at least one second back-contact component, and wherein the surface of the at least one via hole at the level of the at least one semiconductive optoelectronically active layer comprises permanently metalized copper-rich CIGS-type $ABC_2$ material formed when the at least one via hole is formed, and
the permanently metalized copper-rich CIGS-type $ABC_2$ material forming an electrical conductive path between the first front-contact component and the at least one second back-contact component, thereby forming a series-interconnection between a first optoelectronic component and a second optoelectronic component;
at least one busbar-to-back-contact via hole that exposes part of at least one of the first or the second back-contact components;
at least one first electrical conductor forming a first busbar so that an electrical path is formed between the first busbar and the exposed part of the first or the second back-contact component;
at least one busbar-to-front-contact via hole that passes through at least one of the first or the second front-contact components, wherein the busbar-to-front-contact via holes do not pass through the first or the second back-contact components exposed by the busbar-to-back-contact via holes; and
at least one second electrical conductor forming a second busbar that is connected by at least one conductive adhesive component so that an electrical path is formed between the second busbar and the front-contact component.

19. A monolithically-integrated optoelectronic module, comprising a plurality of series-interconnected optoelectronic components that comprise a first optoelectronic component and a second optoelectronic component, wherein the first and the second optoelectronic components each comprise:
at least a portion of a first and a second electrically conductive front-contact component, wherein the first and the second front-contact components each comprise portions of a front-contact layer that are electrically isolated from each other by a front-contact groove;
at least a portion of a first and a second electrically conductive back-contact component, wherein the first and the second back-contact components each comprise portions of a back-contact layer that are electrically isolated from each other by a back-contact groove;
at least a portion of a semiconductive layer comprising at least one semiconductive optoelectronically active layer, wherein the at least one semiconductive active layer comprises a CIGS-type $ABC_2$ material, wherein A comprises copper, B comprises indium and gallium, and C comprises selenium, and the semiconductive layer is disposed between the front-contact layer and the back-contact layer; and
at least one via hole passing through at least a portion of a first front-contact component and at least a portion of the at least one semiconductive optoelectronically active layer, and exposing a portion of the back-contact layer wherein the surface of the via hole at the level of the at least one semiconductive optoelectronically active layer comprises
a permanently metalized copper-rich CIGS-type $ABC_2$ material formed during the via hole forming process, and
the permanently metalized copper-rich CIGS-type $ABC_2$ material forming an electrically conductive path between a first front-contact component and a second back-contact component, thereby forming a series-interconnection between the first optoelectronic component and the second optoelectronic component.

20. The monolithically-integrated optoelectronic module of claim 19, wherein the at least one via hole comprises a plurality of via holes that are positioned in at least one row parallel to the back-contact groove such that the closest row is at a distance of at least 5 micrometers from the back-contact groove.

21. The monolithically-integrated optoelectronic module of claim 19, further comprising at least one metalized grid component made of at least one metalized trace deposited onto at least one of the front contact component, the metalized trace extending from at least one via hole.

22. The monolithically-integrated optoelectronic module of claim 19, wherein at least one of the via holes is filled with electrically conductive material contributing to the electrical contact between at least one of the front-contact components and the back-contact components.

23. The monolithically-integrated optoelectronic module of claim 19, which is encapsulated within at least one front sheet and at least one back sheet, the front sheet comprising glass or thermoplastic polymer material.

24. The monolithically-integrated optoelectronic module of claim 19, further comprising at least one busbar-to-back-contact via hole that exposes part of at least one of the first or the second back-contact components.

* * * * *